US012155367B2

(12) United States Patent
Sai (10) Patent No.: US 12,155,367 B2
(45) Date of Patent: Nov. 26, 2024

(54) METHOD FOR MANUFACTURING CERAMIC SUBSTRATE AND CERAMIC SUBSTRATE (71) Applicant: Murata Manufacturing Co., Ltd., Nagaokakyo (JP)

(72) Inventor: Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 643 days.

(21) Appl. No.: 17/391,850

(22) Filed: Aug. 2, 2021

(65) Prior Publication Data
US 2021/0367578 A1    Nov. 25, 2021

Related U.S. Application Data (63) Continuation of application No. PCT/JP2020/008256, filed on Feb. 28, 2020.

(30) Foreign Application Priority Data

Mar. 29, 2019  (JP) ................ 2019-068267

(51) Int. Cl.
*H03H 9/05* (2006.01)
*H03H 3/02* (2006.01)
(Continued)

(52) U.S. Cl.
CPC ............ *H03H 9/0561* (2013.01); *H03H 3/02* (2013.01); *H03H 9/02102* (2013.01);
(Continued)

(58) Field of Classification Search
CPC .. H03H 3/02; H03H 2003/022; H03H 9/0561; H03H 9/1021; Y10T 29/49126;
(Continued)

(56) References Cited

U.S. PATENT DOCUMENTS

2008/0142147 A1   6/2008  Kawamura et al.
2008/0308976 A1   12/2008 Ito et al.
(Continued)

FOREIGN PATENT DOCUMENTS

JP   H03245556 A    11/1991
JP   2000294899 A *  10/2000 .......... H01L 21/4846
(Continued)

OTHER PUBLICATIONS

JP-2000294899-A translation from FIT database (Year: 2024).*
(Continued)

*Primary Examiner* — Aneeta Yodichkas
*Assistant Examiner* — Joshua D Anderson
(74) *Attorney, Agent, or Firm* — ArentFox Schiff LLP (57) ABSTRACT A method for manufacturing a ceramic substrate that includes forming a mother multilayer body by positioning a hole in at least one ceramic green sheet among a plurality of laminated ceramic green sheets in a location that does not overlap with a recess formation-planned region in which a recess is to be formed after firing of the mother multilayer body and that overlaps with a singulation-planned line for singulating the mother multilayer body into pieces after firing; and forming the recess in the mother multilayer body before firing by performing press working on the recess formation-planned region of the mother multilayer body.

13 Claims, 6 Drawing Sheets (51) Int. Cl.
  *H03H 9/02* (2006.01)
  *H03H 9/10* (2006.01)
  *H03H 9/19* (2006.01)
  *H05K 3/00* (2006.01)
  *H05K 3/12* (2006.01)

(52) U.S. Cl.
  CPC ...... *H03H 9/02133* (2013.01); *H03H 9/1021* (2013.01); *H03H 9/19* (2013.01); *H05K 3/0014* (2013.01); *H05K 3/1291* (2013.01); *H03H 2003/022* (2013.01); *Y10T 29/49158* (2015.01)

(58) Field of Classification Search
  CPC ........ Y10T 29/49158; Y10T 29/49163; H05K 3/0014; H05K 3/0044; H05K 3/0047; H05K 3/005; H05K 3/0052; H05K 3/4629; H05K 3/4697; H05K 2201/0909
  See application file for complete search history.

(56) References Cited

U.S. PATENT DOCUMENTS

| | | |
|---|---|---|
| 2009/0110893 A1 | 4/2009 | Cho et al. |
| 2009/0117357 A1 | 5/2009 | Cho et al. |
| 2009/0148710 A1 | 6/2009 | Cho et al. |
| 2010/0277872 A1 | 11/2010 | Ito et al. |
| 2012/0085481 A1 | 4/2012 | Abe et al. |
| 2013/0307124 A1 | 11/2013 | Wada |
| 2016/0286658 A1 | 9/2016 | Matsubara |
| 2019/0043770 A1 | 2/2019 | Kisaki et al. |

FOREIGN PATENT DOCUMENTS

| | | | |
|---|---|---|---|
| JP | 2002151855 A | | 5/2002 |
| JP | 2005072210 A | | 3/2005 |
| JP | 2006185989 A | | 7/2006 |
| JP | 2006210655 A | * | 8/2006 |
| JP | 2007042893 A | | 2/2007 |
| JP | 2009141368 A | | 6/2009 |
| JP | 2010205844 A | | 9/2010 |
| JP | 2010283074 A | * | 12/2010 |
| JP | 2012084642 A | | 4/2012 |
| JP | 2013243221 A | | 12/2013 |
| JP | 2015170756 A | | 9/2015 |
| JP | 2019046966 A | | 3/2019 |
| WO | 2006114974 A1 | | 11/2006 |
| WO | 2008018227 A1 | | 2/2008 |
| WO | 2015129340 A1 | | 9/2015 |
| WO | 2017126596 A1 | | 7/2017 |

OTHER PUBLICATIONS

JP-2006210655-A translation from FIT database (Year: 2024).*
JP-2010283074-A translation from FIT database (Year: 2024).*
Written Opinion of the International Search Authority issued for PCT/JP2020/008257, date of mailing Apr. 7, 2020.
Written Opinion of the International Search Authority issued for PCT/JP2020/008258, date of mailing Apr. 7, 2020.
Written Opinion of the International Search Authority issued for PCT/JP2020/008256, date of mailing May 19, 2020.
International Search Report issued for PCT/JP2020/008258 date of mailing Apr. 7, 2020.
International Search Report issued for PCT/JP2020/008257 date of mailing Apr. 7, 2020.
International Search Report issued for PCT/JP2020/008256 date of mailing May 19, 2020.

* cited by examiner

METHOD FOR MANUFACTURING CERAMIC SUBSTRATE AND CERAMIC SUBSTRATE

CROSS REFERENCE TO RELATED APPLICATIONS

The present application is a continuation of International application No. PCT/JP2020/008256, filed Feb. 28, 2020, which claims priority to Japanese Patent Application No. 2019-068267, filed Mar. 29, 2019, the entire contents of each of which are incorporated herein by reference.

FIELD OF THE INVENTION

The present invention relates to a method for manufacturing a ceramic substrate and a ceramic substrate.

BACKGROUND OF THE INVENTION

A ceramic substrate is used as a mounting substrate on which an electronic component is mounted, a package that houses an electronic component, or the like. In a ceramic substrate (a package for housing an electronic component) described in Patent Document 1, press working is performed on a top surface of a ceramic green sheet to create a recess therein such that a recess is formed in the ceramic substrate after firing.

Patent Document 1: Japanese Unexamined Patent Application Publication No. 2015-170756

SUMMARY OF THE INVENTION

In Patent Document 1, during the press process, pressure applied to the ceramic green sheet differs between a region where the recess is formed and a region where the recess is not formed in the ceramic green sheet. Due to this, in the ceramic green sheet in which the recess is press-formed, there is a density distribution along the plane between the region having the recess and the region not having the recess. For this reason, warpage may occur in the ceramic substrate after firing.

An object of the present invention is to provide a method for manufacturing a ceramic substrate and a ceramic substrate capable of suitably suppressing warpage.

A method for manufacturing a ceramic substrate according to an aspect of the present invention includes forming a mother multilayer body by positioning a hole in at least one ceramic green sheet among a plurality of laminated ceramic green sheets in a location that does not overlap with a recess formation-planned region in which a recess is to be formed after firing of the mother multilayer body and that overlaps with a singulation-planned line for singulating the mother multilayer body into pieces after firing; and forming the recess in the mother multilayer body before firing by performing press working on the recess formation-planned region of the mother multilayer body.

A ceramic substrate according to an aspect of the present invention includes a substrate base having a plurality of laminated ceramic layers and a mounting surface; and a wall portion on the substrate base and surrounding the mounting surface, wherein an orientation of a grain boundary indicating an interlaminar portion between the plurality of laminated ceramic layers curves along the mounting surface and an inner wall surface of the wall portion and does not intersect with an end surface of either of the substrate base and the wall portion.

According to the present invention, it is possible to appropriately suppress warpage.

DETAILED DESCRIPTION OF THE PREFERRED EMBODIMENTS

Hereinafter, a method for manufacturing a ceramic substrate and embodiments of a ceramic substrate according to the present invention will be described in detail with reference to the accompanying drawings. It should be noted that the present invention is not limited by the embodiments. It goes without saying that each of the embodiments is merely an example, and partial replacement or combination of the configurations described in different embodiments can be carried out. In a first modified example and examples subsequent to a first modified example, description of constituent elements common to the embodiments will be omitted, and only different points therefrom will be described. In particular, similar actions and effects by similar configurations will not be described in detail for each embodiment.

Figure 1:
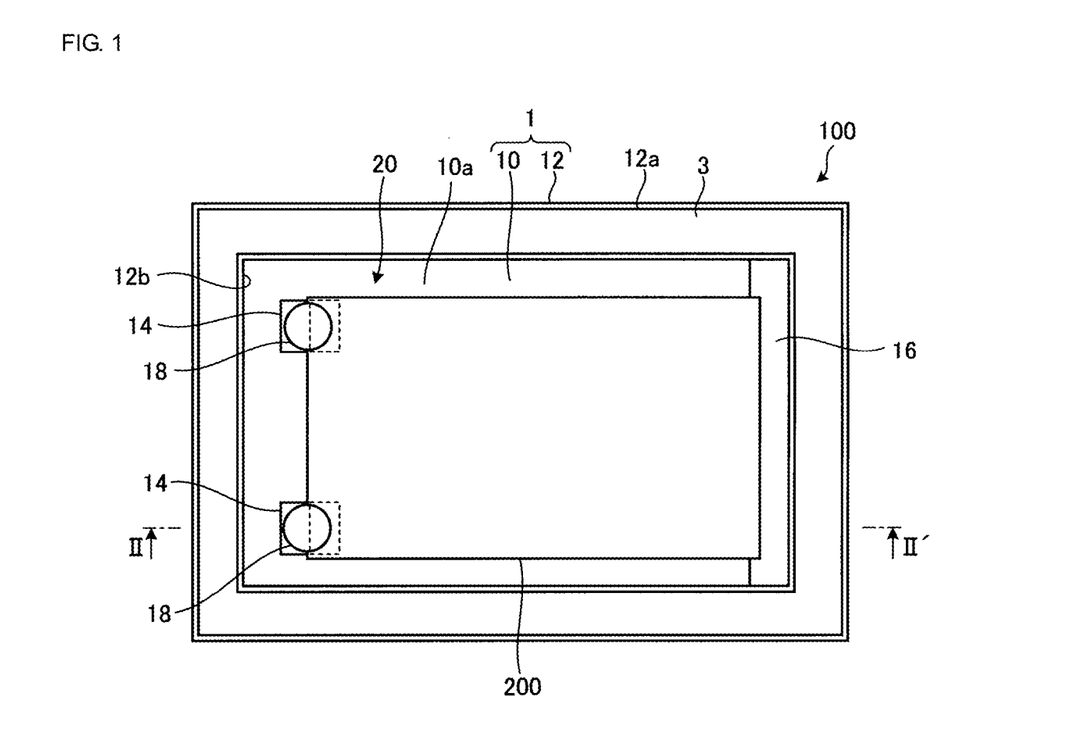
FIG. 1 is a plan view illustrating a configuration of a package including a ceramic substrate according to an embodiment.
Figure 2:
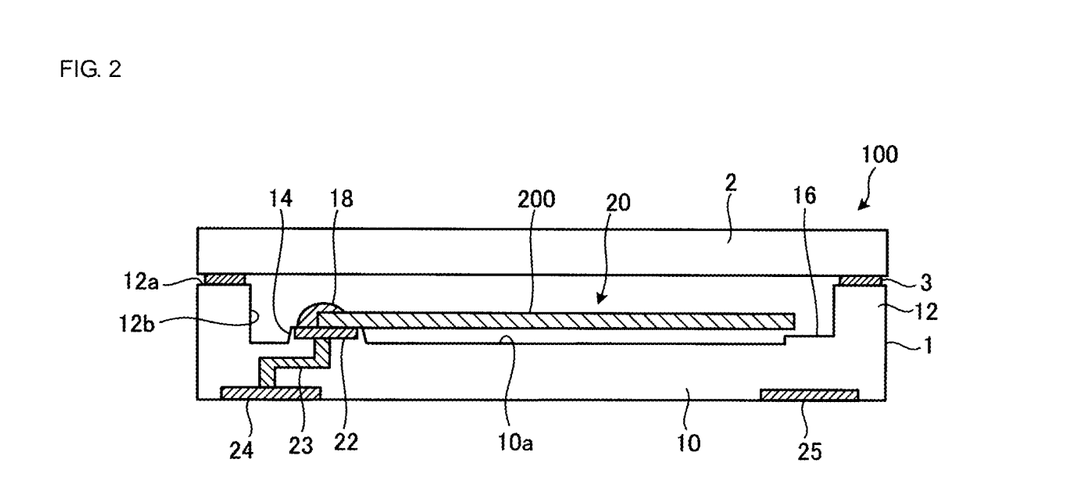
FIG. 2 is a cross-sectional view taken along a line II-II' in FIG. 1.

FIG. 1 is a plan view illustrating a configuration of a package including a ceramic substrate according to an embodiment. FIG. 2 is a cross-sectional view taken along a line II-II' in FIG. 1. FIG. 1 illustrates a plan view of a ceramic substrate 1 with a lid 2 of a package 100 removed.

As illustrated in FIG. 1, the package 100 includes the ceramic substrate 1. The ceramic substrate 1 has a substrate base 10 and a wall portion 12. The wall portion 12 is formed in a frame shape surrounding a mounting surface 10a of the substrate base 10. In other words, a recess 20 is provided on a top surface of the ceramic substrate 1. The ceramic substrate 1 has a rectangular shape in a plan view. In the following description, a plan view represents a relationship of arrangement when viewed from a direction perpendicular to the mounting surface 10a.

An electronic component 200 is housed in the recess 20 of the ceramic substrate 1. More specifically, the electronic component 200 is a quartz oscillator. A pedestal 14 for mounting the electronic component 200 is provided on the mounting surface 10a of the substrate base 10. The pedestal 14 is provided near a corner of the mounting surface 10a, and is disposed separate from the wall portion 12. A supporter 16 is provided on the mounting surface 10a of the substrate base 10. The supporter 16 is disposed on a side opposite to the pedestal 14. One end side of the electronic component 200 is joined onto the pedestal 14 by a joining member 18. The other end side of the electronic component 200 is located on the upper side of the supporter 16. The electronic component 200 is disposed separate from the mounting surface 10a, the supporter 16, and an inner wall surface 12b of the wall portion 12.

As illustrated in FIG. 2, a connection electrode 22 electrically connected to the electronic component 200 is provided on a top surface of the pedestal 14. Bottom electrodes 24 and 25 are provided on a lower surface of the ceramic substrate 1. The connection electrode 22 and the bottom electrode 24 are electrically connected to each other via a via 23 provided in the substrate base 10.

A metallized layer 3 is provided on a top surface 12a of the wall portion 12. The lid 2 is joined to the ceramic substrate 1 via the metallized layer 3. With this, a space surrounded by the substrate base 10, the wall portion 12, and the lid 2 is hermetically sealed.

Figure 3:
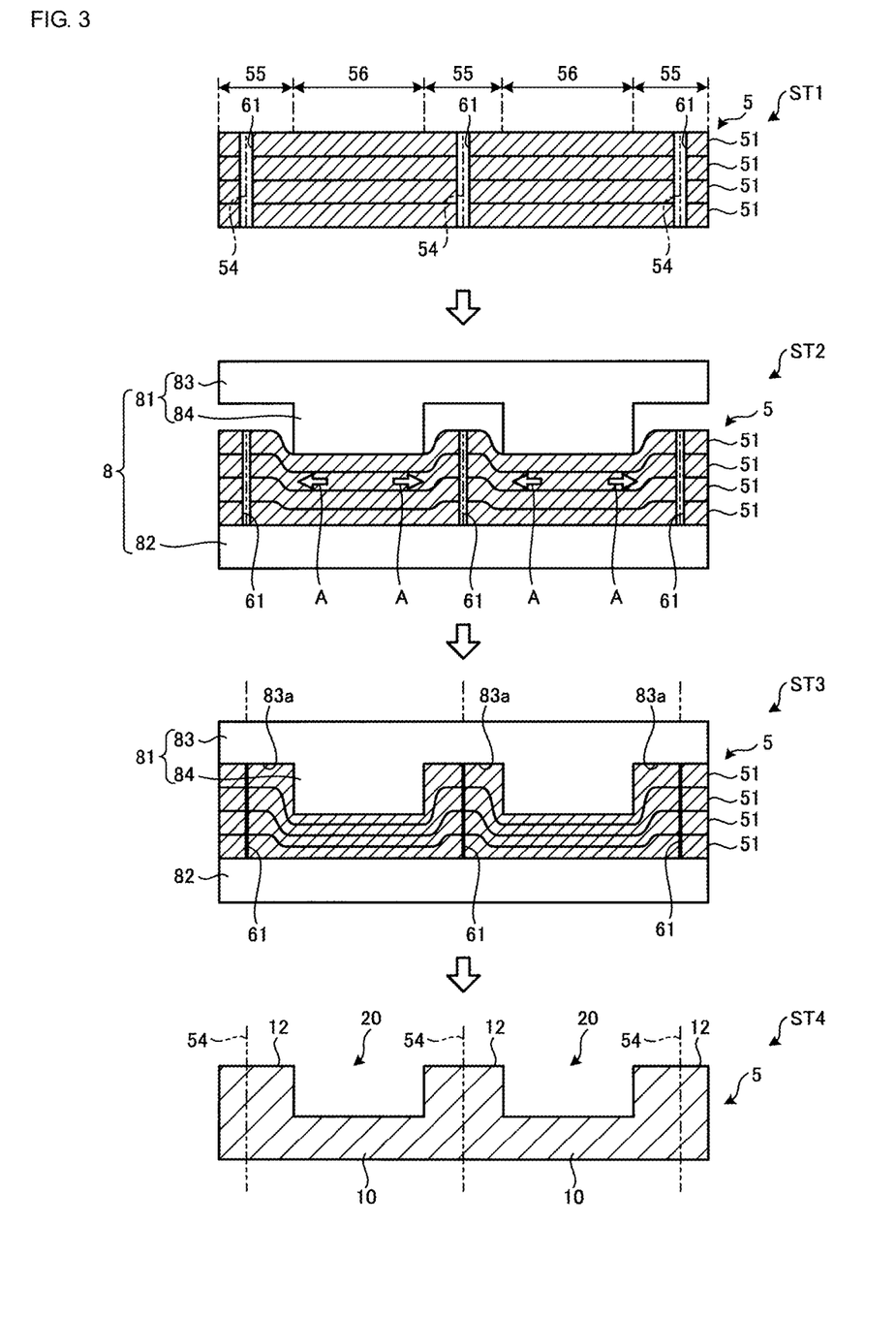
FIG. 3 is an explanatory diagram for describing a method for manufacturing a ceramic substrate.

Next, a method for manufacturing the ceramic substrate 1 will be described. FIG. 3 is an explanatory diagram for describing a method for manufacturing a ceramic substrate. As illustrated in FIG. 3, the method for manufacturing the ceramic substrate 1 includes a step of forming a mother multilayer body 5 by forming holes 61 in a plurality of ceramic green sheets 51 and laminating the plurality of ceramic green sheets 51 (step ST1).

The ceramic green sheet 51 includes ceramic powder containing aluminum oxide ($Al_2O_3$) as a main ingredient, an organic binder, and a resin material such as a thermoplastic resin. The ceramic green sheet 51 is formed by coating while using, for example, a doctor blade or a lip coater.

As illustrated in FIG. 3, the holes 61 are each formed in a position overlapping with a singulation-planned line 54 of the plurality of ceramic green sheets 51. The singulation-planned line 54 is a virtual line along which the mother multilayer body 5 is to be singulated into pieces of ceramic substrates 1 after firing. Although not illustrated in FIG. 3, in each of the plurality of ceramic green sheets 51, in addition to the holes 61, the via 23 and various electrodes such as the connection electrode 22 and the bottom electrodes 24, 25 are formed. The mother multilayer body 5 is formed by laminating the plurality of ceramic green sheets 51 in which the holes 61 are formed. The holes 61 of the plurality of ceramic green sheets 51 are provided in the positions overlapping each other. Accordingly, the mother multilayer body 5 has the holes 61 each formed to pass from the top surface through the lower surface thereof.

The mother multilayer body 5 has a wall formation-planned region 55 and a recess formation-planned region 56. The wall formation-planned region 55 is a region in which the wall portion 12 of the ceramic substrate 1 is to be formed after the mother multilayer body 5 is fired and singulated. The recess formation-planned region 56 is a region in which the recess 20 of the ceramic substrate 1 is to be formed after the mother multilayer body 5 is fired and singulated. A plurality of the holes 61 are provided in the wall formation-planned region 55 of the mother multilayer body 5. That is, each of the plurality of holes 61 are provided in a position that does not overlap with the recess formation-planned region 56 of the mother multilayer body 5 and overlap with the singulation-planned line 54 thereof.

Figure 4:
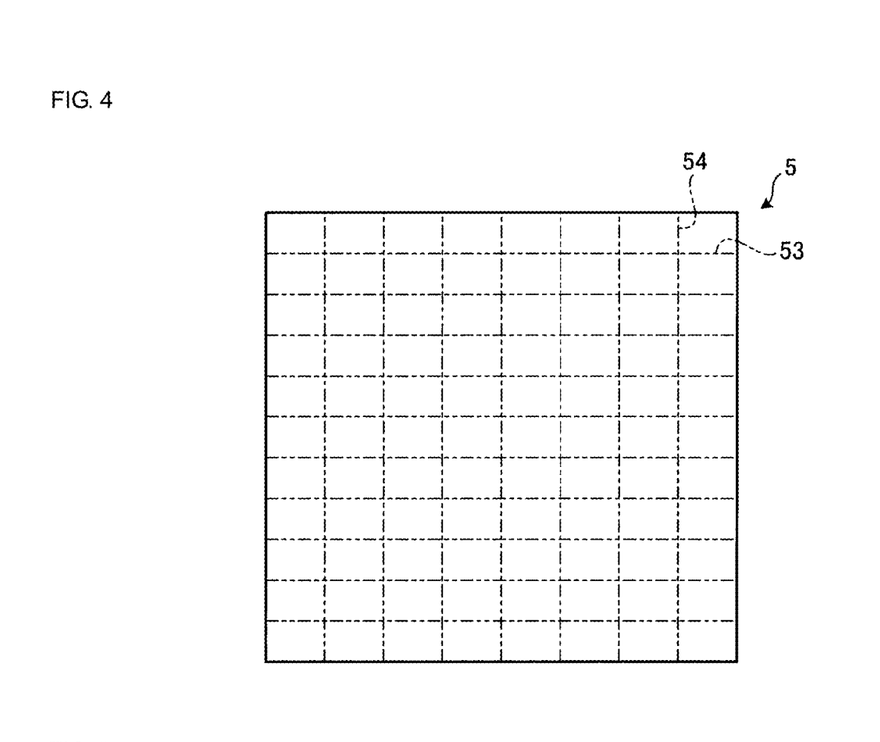
FIG. 4 is a plan view illustrating a mother multilayer body.

FIG. 4 is a plan view illustrating a mother multilayer body. As illustrated in FIG. 4, in the mother multilayer body 5, singulation-planned lines 53 and 54 are provided in a matrix shape. The mother multilayer body 5 is singulated into pieces of the ceramic substrates 1 at the singulation-planned lines 53 and 54 after firing. That is, each of regions surrounded by the singulation-planned lines 53 and 54 corresponds to one ceramic substrate 1. Grooves for singulation may be formed on the positions overlapping with the singulation-planned lines 53 and 54 in the mother multilayer body 5. For example, a roller break apparatus or a dicer may be used as equipment for the singulation into pieces of the ceramic substrates 1.

Figure 5:
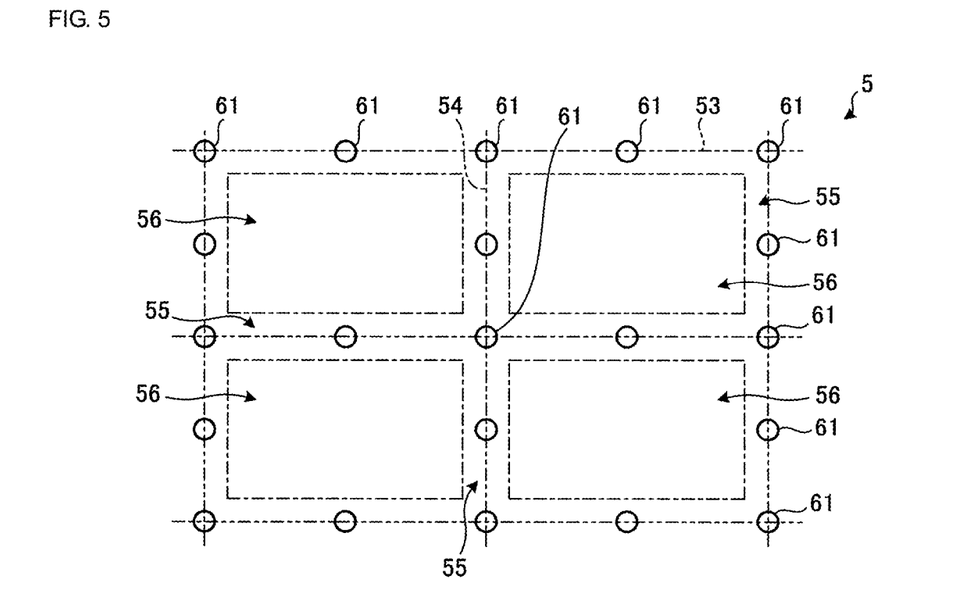
FIG. 5 is an enlarged plan view of a mother multilayer body.

FIG. 5 is an enlarged plan view of a mother multilayer body. In FIG. 5, the plurality of ceramic green sheets 51 are laminated, and then the mother multilayer body 5 before press working is illustrated. As illustrated in FIG. 5, each of the plurality of holes 61 has a circular shape in a plan view, and are arranged along the singulation-planned lines 53 and 54. More specifically, each of the plurality of holes 61 are provided in a position overlapping with an intersection point of the singulation-planned line 53 and the singulation-planned line 54. Each of the plurality of holes 61 are also provided in a position overlapping with the singulation-planned line 53 or 54 between the intersection points.

Next, as illustrated in FIG. 3, a pressing jig 8 forms the recess 20 in the mother multilayer body 5 by pressing the recess formation-planned region 56 of the mother multilayer body 5. The pressing jig 8 includes an upper mold 81 and a lower mold 82. The mother multilayer body 5 is disposed between the lower mold 82 and the upper mold 81. The upper mold 81 includes a base 83 and a projection 84.

The upper mold 81 performs press working from the top surface side of the mother multilayer body 5. With this, the recess formation-planned region 56 of the mother multilayer body 5 is pressed by the projection 84 first (step ST2). The plurality of ceramic green sheets 51 deform along the shape of the projection 84 by the pressure applied from the projection 84. That is, the ceramic green sheet 51 in the recess formation-planned region 56 is thinned and pushed in a direction indicated by an arrow A, and flows toward the wall formation-planned region 55 side. The thickness of the wall formation-planned region 55 becomes thicker than that of the recess formation-planned region 56, and the width of the holes 61 become smaller due to the flow of the ceramic green sheet 51.

Further, by the pressure applied by the upper mold 81 (step ST3), the mother multilayer body 5 deforms to cover a lower surface and side surfaces of the projection 84, and the wall formation-planned region 55 is brought into contact with a lower surface 83a of the base 83. The plurality of ceramic green sheets 51 curves along the lower surface and side surfaces of the projection 84, and the lower surface 83a of the base 83. As a result, the shape of the projection 84 is transferred to the mother multilayer body 5. Further, due to the flow of the ceramic green sheet 51 in the recess formation-planned region 56, an inner wall of the holes 61 is brought into close contact with each other, and the mother multilayer body 5 is integrally formed on the singulation-planned line 54.

Then, the mother multilayer body 5 including the recesses 20 is obtained by removing the pressing jig 8 (step ST4).

According to the method for manufacturing the ceramic substrate 1 of the present embodiment, since the holes 61 are provided in the mother multilayer body 5, the fluidity of the ceramic green sheets 51 during the press working may be improved. That is, when pressure is applied to the ceramic green sheet 51 by the pressing jig 8, the ceramic green sheet 51 in the recess formation-planned region 56 easily flows toward the wall formation-planned region 55 side due to the holes 61.

As a result, in the present embodiment, the distribution of the pressure in the ceramic green sheet 51 during the press working is relaxed in comparison with a case where the holes 61 are not formed, and the recess 20 can be formed by deforming the recess formation-planned region 56 and the wall formation-planned region 55 with a small pressure. Alternatively, it is possible to form a deeper recess 20 with the same pressure in comparison with the case where the holes 61 are not formed.

Accordingly, in the mother multilayer body 5 after press working, it is possible to suppress a difference in density of the ceramic green sheet 51 by the recess formation-planned region 56 and the wall formation-planned region 55. As a result, it is possible to suppress warpage of the ceramic substrate 1 formed after the mother multilayer body 5 is fired and singulated.

As illustrated in FIG. 5, the plurality of holes 61 are provided to surround the periphery of the recess formation-planned region 56. More preferably, the plurality of holes 61 are provided in symmetrical positions across the recess formation-planned region 56. With this, when press working is performed by the pressing jig 8, the ceramic green sheet 51 in the recess formation-planned region 56 is likely to flow evenly toward the wall formation-planned region 55 side in the periphery thereof.

Figure 6:
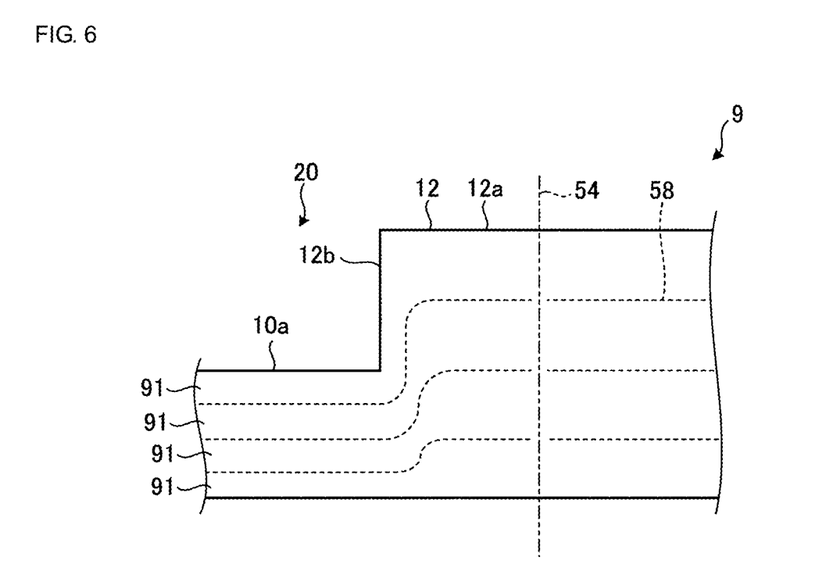
FIG. 6 is a cross-sectional view schematically illustrating a mother multilayer body after firing.

FIG. 6 is a cross-sectional view schematically illustrating a mother multilayer body after firing. As illustrated in FIG. 6, in a fired mother multilayer body 9, an orientation of a grain boundary 58 indicating an interlaminar portion between a plurality of ceramic layers 91 curves along the mounting surface 10a, and the inner wall surface 12b and the top surface 12a of the wall portion 12, due to the flow of the ceramic green sheets 51 during the press working.

In a portion overlapping with the singulation-planned line 54 provided with the holes 61, the flowing ceramic green sheets 51 are brought into close contact with each other to be formed integrally. Due to this, in the fired mother multilayer body 9, the grain boundary 58 is arranged along the singulation-planned line 54. With this, when the fired mother multilayer body 9 is singulated at the singulation-planned line 54 into pieces of the ceramic substrates 1, the grain boundary 58 does not intersect with an end surface of any of the wall portion 12 and the substrate base 10. Accordingly, in the present embodiment, it is possible to suppress the generation of cracks, the separation of ceramic particles, and the like in the step of singulating into pieces of the ceramic substrates. In addition, since the bending strength of the ceramic substrate 1 on the singulation-planned line 54 can be made smaller than the bending strength of other portions of the ceramic substrate 1, it is possible to reduce the stress when the ceramic substrate 1 is obtained by singulation using a roller break apparatus.

First Modified Example

Figure 7:
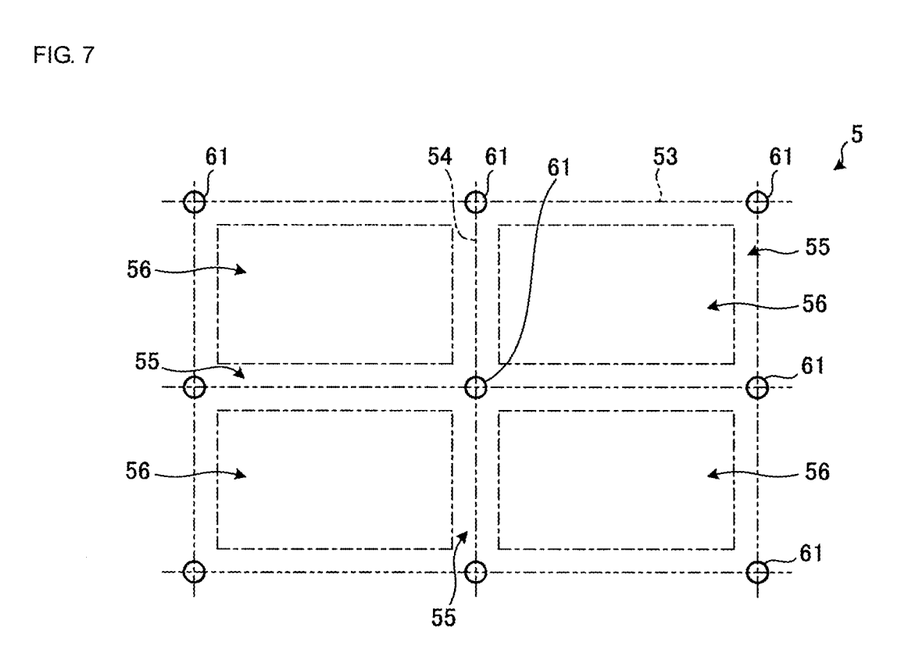
FIG. 7 is an enlarged plan view of a mother multilayer body according to a first modified example.

FIG. 7 is an enlarged plan view of a mother multilayer body according to a first modified example. In the following description, the same constituent elements as those in the above-described embodiment are denoted by the same reference signs, and description thereof will be omitted.

In the first modified example, a configuration will be described in which holes 61 are provided only in an intersection point of singulation-planned lines 53 and 54 in a mother multilayer body 5, unlike the configuration of the above-described embodiment. More specifically, as illustrated in FIG. 7, each of a plurality of holes 61 are not provided in a position that overlaps with the singulation-planned line 53 or 54 between the intersection points of the singulation-planned lines 53 and 54. Four holes 61 are provided around one recess formation-planned region 56.

In the first modified example, the number of holes 61 is smaller than that in the above-described embodiment. Even in this case, during the press working, the ceramic green sheets 51 in four recess formation-planned regions 56 arranged in the periphery of the holes 61 flow into the holes 61. With this, in the first modified example, it is possible to effectively improve the fluidity of the ceramic green sheets 51.

Second Modified Example

Figure 8:
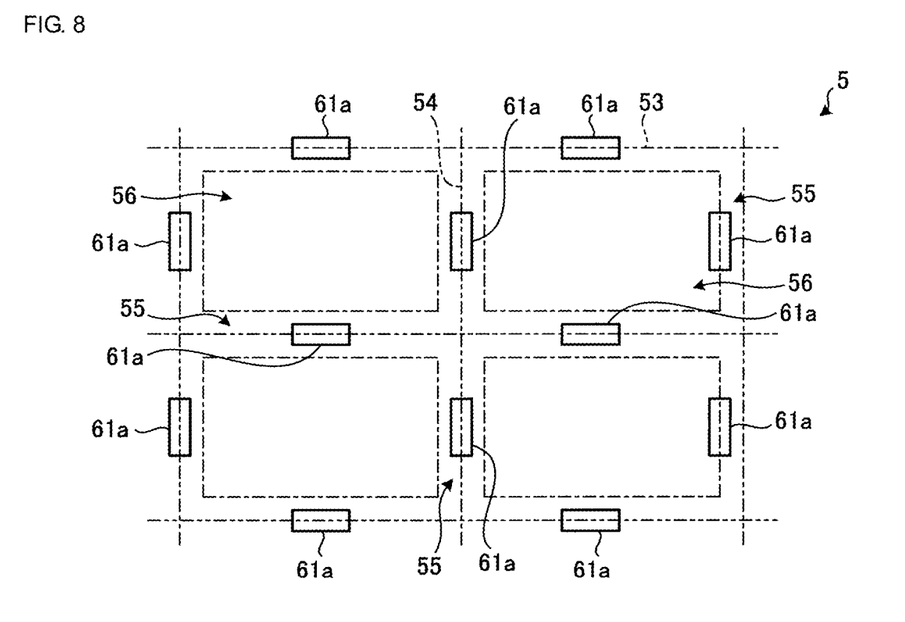
FIG. 8 is an enlarged plan view of a mother multilayer body according to a second modified example.

FIG. 8 is an enlarged plan view of a mother multilayer body according to a second modified example. In the second modified example, a configuration will be described in which holes 61a are formed in a rectangular shape extending along a singulation-planned line 53 or 54 in a plan view, unlike the configurations of the above-described embodiment and first modified example.

More specifically, as illustrated in FIG. 8, each of a plurality of holes 61a are provided between two recess formation-planned regions 56 adjacent to each other across a wall formation-planned region 55. Each of the plurality of holes 61a is not provided in a position that overlaps with an intersection point of the singulation-planned lines 53 and 54, but is located in a center portion of adjacent intersection points.

In the second modified example, an area (volume) of one hole 61a is larger than that of the hole 61 in the above-described embodiment and first modified example. Accordingly, it is possible to increase the volume of the ceramic green sheet 51 flowing into the holes 61a during the press working, and it is possible to more preferably improve the fluidity of the ceramic green sheet 51.

Third Modified Example

Figure 9:
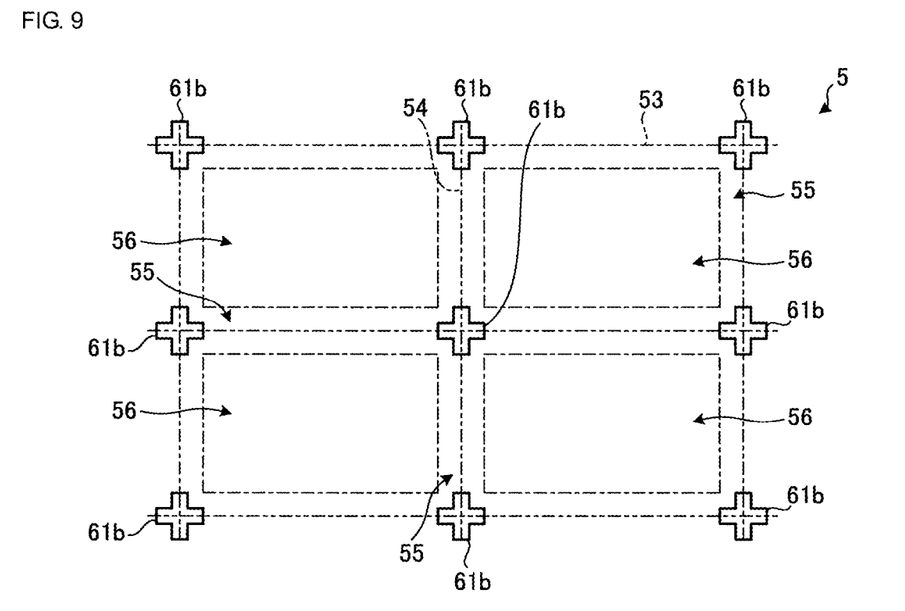
FIG. 9 is an enlarged plan view of a mother multilayer body according to a third modified example.

FIG. 9 is an enlarged plan view of a mother multilayer body according to a third modified example. In the third modified example, a configuration will be described in which holes 61b are formed in a cross shape in a plan view, unlike the configurations of the above-described embodiment, first modified example, and second modified example.

More specifically, as illustrated in FIG. 9, each of a plurality of holes 61b formed in a cross shape are provided in a position that overlaps with an intersection point of singulation-planned lines 53 and 54. Each of the plurality of holes 61b are formed in the cross shape in which a rectangular portion extending along the singulation-planned line 53 and a rectangular portion extending along the singulation-planned line 54 intersect each other.

In the third modified example, it is possible to secure areas (volumes) of the plurality of holes 61b while suppressing an increase in width of a wall formation-planned region 55. The fluidity of the ceramic green sheet 51 may be improved even when the holes 61b are not allowed to be provided in the wall formation-planned region 55 between two recess formation-planned regions 56 adjacent to each other, when the width of the wall formation-planned region 55 is small, or the like.

Fourth Modified Example

Figure 10:
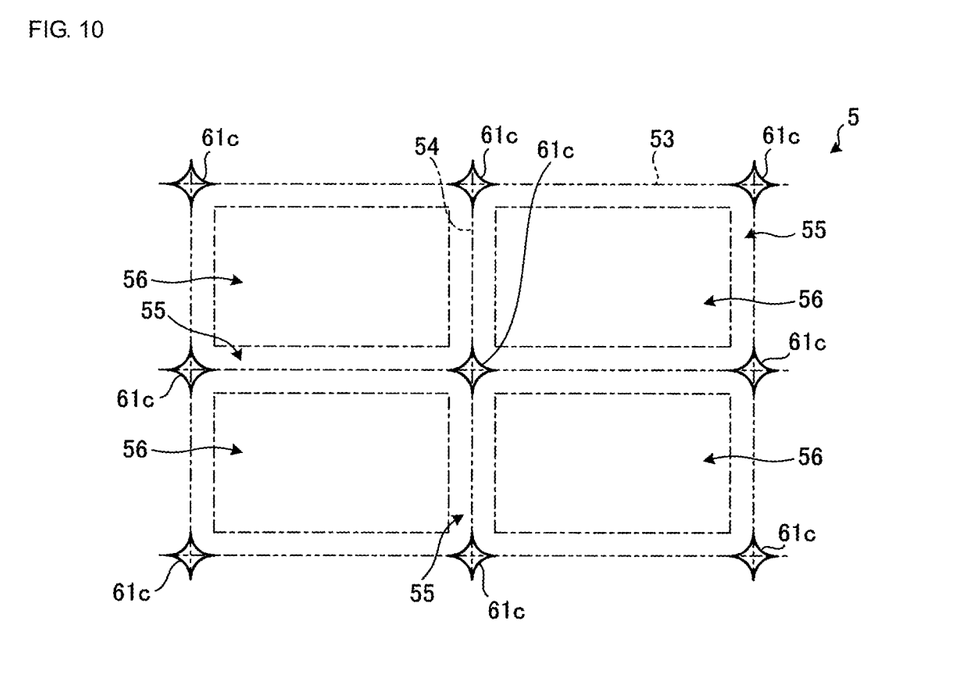
FIG. 10 is an enlarged plan view of a mother multilayer body according to a fourth modified example.

FIG. 10 is an enlarged plan view of a mother multilayer body according to a fourth modified example. In the fourth modified example, a configuration will be described in which holes 61c are formed in a rhombus shape with each of sides being curved in a plan view, unlike the configurations of the above-described embodiment, first modified example, second modified example, and third modified example.

More specifically, as illustrated in FIG. 10, each of a plurality of holes 61c are provided in a position that overlaps with an intersection point of singulation-planned lines 53 and 54. Each side of the plurality of holes 61c has a curved shape that is recessed toward a center portion of the rhombus shape. In other words, each side of the plurality of holes 61c curves in a direction away from a corner of a recess formation-planned region 56.

With this, in the fourth modified example, it is possible to efficiently dispose the plurality of holes 61c, and secure areas (volumes) of the plurality of holes 61c while suppressing an increase in width of a wall formation-planned region 55.

Fifth Modified Example

Figure 11:
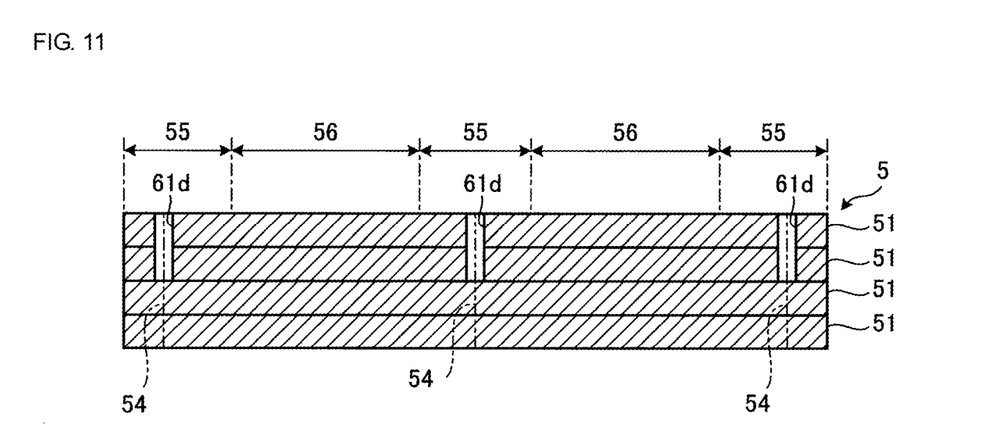
FIG. 11 is an enlarged cross-sectional view of a mother multilayer body according to a fifth modified example.

FIG. 11 is an enlarged cross-sectional view of a mother multilayer body according to a fifth modified example. In the fifth modified example, a configuration will be described in which holes 61d are formed in some ceramic green sheets 51, among a plurality of ceramic green sheets 51 constituting a mother multilayer body 5, that are located on the top surface side of the mother multilayer body 5, unlike the configurations of the embodiment and the first to fourth modified examples described above.

Specifically, as illustrated in FIG. 11, the holes 61d are formed in two ceramic green sheets 51 located on the top surface side of the mother multilayer body 5, and no holes 61d are formed in two ceramic green sheets 51 located on the lower surface side thereof. The holes 61d open in the top surface of the mother multilayer body 5, and the ceramic green sheet 51 is provided to the bottom of the holes 61d.

With this, during the press working, the ceramic green sheet 51 is likely to flow toward the upper portion of a wall formation-planned region 55 provided with the holes 61d. That is, since the fluidity of the ceramic green sheet 51 from the lower surface side toward the top surface side is improved in the wall formation-planned region 55, the fluidity of the ceramic green sheet 51 in the recess formation-planned region 56 is improved as a result.

FIG. 11 illustrates an example in which the holes 61d are formed in the two ceramic green sheets 51, but the present invention is not limited thereto. It is sufficient that the holes 61d are formed in at least one ceramic green sheet 51 among the plurality of ceramic green sheets 51 constituting the mother multilayer body 5.

The configurations of the embodiment and the first to fifth modified examples described above may be appropriately combined. For example, the arrangement of the holes 61 described in the embodiment and the first modified example may be combined with the shapes in the plan view of the holes 61a, 61b, and 61c described in the second, third, and fourth modified examples. The configuration of the fifth modified example may also be applied in each of the embodiment and the first to fourth modified examples.

The configurations of the embodiment and the first to fifth modified examples described above are merely examples, and may be changed as appropriate. For example, the number of multiple ceramic green sheets 51 constituting the mother multilayer body 5 is not limited to four, and may be five or more or may be three or less.

The cross-sectional shape of the recess 20 is part of a shape of a rectangle including corners, but is not limited thereto. A connecting portion between the inner wall surface 12b and the mounting surface 10a of the recess 20 may be formed by a bending curved surface. Alternatively, the mounting surface 10a of the recess 20 may be formed having a curved surface.

The number, arrangement, and shape in a plan view of the holes 61 may be changed as appropriate. For example, in FIG. 5, two or more holes 61 may be arranged between adjacent intersection points. Alternatively, the shape of the holes 61 in a plan view is not limited to a circular shape, a rectangular shape, or a rhombus shape, and may be another shape such as a polygonal shape.

The electronic component 200 illustrated in FIGS. 1 and 2 is not limited to a quartz oscillator, and may be another electronic component.

Note that the above-described embodiments are intended to facilitate the understanding of the present invention and are not intended to limit the interpretation of the present invention. The present invention can be modified/improved without departing from the gist thereof, and the present invention also includes equivalents thereof.

REFERENCE SIGNS LIST

1 CERAMIC SUBSTRATE
2 LID
3 METALLIZED LAYER
5 MOTHER MULTILAYER BODY
8 PRESSING JIG
9 MOTHER MULTILAYER BODY AFTER FIRING
10 SUBSTRATE BASE
10a MOUNTING SURFACE
12 WALL PORTION
12a TOP SURFACE
12b INNER WALL SURFACE
14 PEDESTAL
16 SUPPORTER
18 JOINING MEMBER
20 RECESS
22 CONNECTION ELECTRODE
23 VIA
24, 25 BOTTOM ELECTRODE
51 CERAMIC GREEN SHEET
53, 54 SINGULATION-PLANNED LINE
55 WALL FORMATION-PLANNED REGION
56 RECESS FORMATION-PLANNED REGION
58 GRAIN BOUNDARY
61, 61a, 61b, 61c, 61d HOLE
81 UPPER MOLD
82 LOWER MOLD
83 BASE
84 PROJECTION
91 CERAMIC LAYER
100 PACKAGE
200 ELECTRONIC COMPONENT
A ARROW

The invention claimed is:

1. A method for manufacturing a ceramic substrate, the method comprising:
   forming a mother multilayer body by positioning a hole in at least one ceramic green sheet among a plurality of laminated ceramic green sheets in a location that does not overlap with a recess formation-planned region and that overlaps with a singulation-planned line for singulating the mother multilayer body into pieces after firing; and forming a recess in the mother multilayer body before firing by performing press working on the recess formation-planned region of the mother multilayer body, wherein, in the forming of the recess, the press working on the recess formation-planned region causes portions of an inner wall of the hole to come into close contact with each other by a flow of the at least one ceramic green sheet.

2. The method for manufacturing the ceramic substrate according to claim 1, wherein the hole passes from a top surface through a lower surface of the mother multilayer body.

3. The method for manufacturing the ceramic substrate according to claim 1, wherein the hole is formed in some of the ceramic green sheets that are located on the top surface side of the mother multilayer body among the plurality of ceramic green sheets of the mother multilayer body.

4. The method for manufacturing the ceramic substrate according to claim 1, wherein the hole is in a position that overlaps with an intersection point of the singulation-planned lines in a plan view from a direction perpendicular to a top surface of the mother multilayer body.

5. The method for manufacturing the ceramic substrate according to claim 4, wherein the hole has a circular shape in the plan view from the direction perpendicular to the top surface of the mother multilayer body.

6. The method for manufacturing the ceramic substrate according to claim 4, wherein the hole has a cross shape in a plan view from the direction perpendicular to the top surface of the mother multilayer body.

7. The method for manufacturing the ceramic substrate according to claim 4, wherein the hole has a rhombus shape with each of sides thereof being curved in a plan view from the direction perpendicular to the top surface of the mother multilayer body.

8. The method for manufacturing the ceramic substrate according to claim 1, wherein the hole has a circular shape in a plan view from a direction perpendicular to a top surface of the mother multilayer body.

9. The method for manufacturing the ceramic substrate according to claim 1, wherein the hole has a rectangular shape that extends along the singulation-planned lines in a plan view from a direction perpendicular to a top surface of the mother multilayer body.

10. The method for manufacturing the ceramic substrate according to claim 9, wherein the hole is in a position that does not overlap with an intersection point of the singulation-planned lines in the plan view from the direction perpendicular to the top surface of the mother multilayer body.

11. The method for manufacturing the ceramic substrate according to claim 1, wherein the hole has a cross shape in a plan view from a direction perpendicular to a top surface of the mother multilayer body.

12. The method for manufacturing the ceramic substrate according to claim 1, wherein the hole has a rhombus shape with each of sides thereof being curved in a plan view from a direction perpendicular to a top surface of the mother multilayer body.

13. The method for manufacturing the ceramic substrate according to claim 1, further comprising firing the mother multilayer body.

* * * * *